(12) United States Patent
O'Hare (10) Patent No.: US 9,390,202 B2
(45) Date of Patent: Jul. 12, 2016

(54) COORDINATE MEASURING SYSTEM DATA REDUCTION

(75) Inventor: Jonathan J. O'Hare, Warwick, RI (US)

(73) Assignee: Hexagon Metrology, Inc., North Kingstown, RI (US)

( * ) Notice: Subject to any disclaimer, the term of this patent is extended or adjusted under 35 U.S.C. 154(b) by 479 days.

(21) Appl. No.: 13/560,724

(22) Filed: Jul. 27, 2012

(65) Prior Publication Data

US 2013/0030773 A1 Jan. 31, 2013

Related U.S. Application Data

(60) Provisional application No. 61/513,451, filed on Jul. 29, 2011.

(51) Int. Cl.
*G06F 17/50* (2006.01)
*G01B 21/04* (2006.01)
*G06T 7/00* (2006.01)
*G06T 17/00* (2006.01)

(52) U.S. Cl.
CPC ............... *G06F 17/50* (2013.01); *G01B 21/04* (2013.01); *G06T 7/0032* (2013.01); *G06T 17/00* (2013.01); *G06T 2207/10028* (2013.01); *G06T 2210/56* (2013.01)

(58) Field of Classification Search
CPC ...................................... G01B 21/04
USPC .............................................. 703/1
See application file for complete search history.

(56) References Cited

U.S. PATENT DOCUMENTS 5,471,406 A * 11/1995 Breyer et al. ................. 702/168
5,471,878 A 12/1995 Chiao et al.
5,610,846 A * 3/1997 Trapet et al. ................... 702/95
5,936,627 A 8/1999 Brown
6,161,079 A * 12/2000 Zink ...................... G01B 21/04
                                                        33/503
6,330,523 B1 12/2001 Kacyra et al.

(Continued)

FOREIGN PATENT DOCUMENTS

CN  101672637 A  3/2010
CN  101692257 A  4/2010

OTHER PUBLICATIONS

Hussain et al. ("Reverse Engineering: Point Cloud Generation With CMM for Part Modeling and Error Analysis", Asian Research Publishing Network, 2008, pp. 37-40).*

(Continued)

*Primary Examiner* — Omar Fernandez Rivas
*Assistant Examiner* — Iftekhar Khan
(74) *Attorney, Agent, or Firm* — Wolf, Greenfield & Sacks, P.C.

(57) ABSTRACT

Coordinate measurement data such as point cloud data associated with coordinate measurement machine data is reduced in a strategic and systematic manner by segmenting and/or reducing data based on nominal geometric information contained in an electronic file such as a CAD model or a coordinate measurement machine inspection plan. For example, in one embodiment, a software application is used to identify geometric features and tolerances within a CAD model of an object, and to segment coordinate measurement data of a physical object based on the identified geometric features and tolerances from the CAD model. The various segments of coordinate measurement data may be assigned different data requirements, and the data may be reduced in different manners on a feature-by-feature basis.

18 Claims, 6 Drawing Sheets

(56) References Cited

U.S. PATENT DOCUMENTS

| | | | |
|---|---|---|---|
| 6,359,960 B1 | 3/2002 | Wahl et al. | |
| 6,611,617 B1* | 8/2003 | Crampton | 382/154 |
| 6,690,820 B2 | 2/2004 | Lees et al. | |
| 6,708,138 B1* | 3/2004 | Zhang | G01B 21/04 702/182 |
| 6,720,966 B2 | 4/2004 | Barth et al. | |
| 6,765,570 B1 | 7/2004 | Cheung et al. | |
| 6,778,172 B2 | 8/2004 | Harada et al. | |
| 6,788,210 B1* | 9/2004 | Huang | G06T 17/10 340/612 |
| 6,914,601 B2 | 7/2005 | Fujiwara et al. | |
| 6,987,878 B2 | 1/2006 | Lees et al. | |
| 7,006,085 B1 | 2/2006 | Acosta et al. | |
| 7,024,027 B1 | 4/2006 | Suri et al. | |
| 7,061,484 B2 | 6/2006 | Bailey et al. | |
| 7,088,848 B2 | 8/2006 | Faber | |
| 7,098,908 B2 | 8/2006 | Acosta et al. | |
| 7,133,047 B2 | 11/2006 | Pallister | |
| 7,248,258 B2 | 7/2007 | Acosta et al. | |
| 7,327,857 B2* | 2/2008 | Lloyd et al. | 382/106 |
| 7,372,462 B2 | 5/2008 | Harada | |
| 7,477,261 B2 | 1/2009 | Pallister | |
| 7,492,415 B2 | 2/2009 | Delanghe et al. | |
| 7,502,026 B2 | 3/2009 | Acosta et al. | |
| 7,620,023 B2 | 11/2009 | Gielty et al. | |
| 7,620,234 B2 | 11/2009 | Taylor | |
| 7,646,672 B2 | 1/2010 | Klüver | |
| 7,650,023 B2 | 1/2010 | Fischer et al. | |
| 7,653,243 B2 | 1/2010 | Grady | |
| 7,684,613 B2 | 3/2010 | Harada et al. | |
| 7,697,010 B2 | 4/2010 | Pallister | |
| 7,804,988 B2 | 9/2010 | Flohr et al. | |
| 7,805,442 B1 | 9/2010 | Joshi et al. | |
| 8,089,689 B1* | 1/2012 | Savage-Leuchs | 359/341.1 |
| 8,255,184 B2* | 8/2012 | Chang et al. | 702/150 |
| 8,520,930 B2* | 8/2013 | Van Coppenolle | 382/152 |
| 8,773,700 B2* | 7/2014 | Inoue et al. | 358/1.15 |
| 8,825,427 B2* | 9/2014 | Kunzmann | G01B 21/042 702/85 |
| 8,958,654 B1* | 2/2015 | Evans et al. | 382/254 |
| 2001/0027381 A1* | 10/2001 | Kikuchi | G01B 21/04 702/155 |
| 2002/0130873 A1 | 9/2002 | Takakura et al. | |
| 2004/0028274 A1 | 2/2004 | Kawakami et al. | |
| 2006/0273268 A1 | 12/2006 | Bae et al. | |
| 2008/0075227 A1* | 3/2008 | Christoph et al. | 378/23 |
| 2009/0027412 A1 | 1/2009 | Burley et al. | |
| 2009/0040530 A1* | 2/2009 | Heiden | G01B 11/005 356/500 |
| 2009/0307916 A1* | 12/2009 | McLean | G01B 21/04 33/503 |
| 2010/0079140 A1 | 4/2010 | Holthuizen et al. | |
| 2010/0142798 A1* | 6/2010 | Weston et al. | 382/141 |
| 2010/0268355 A1* | 10/2010 | Chang et al. | 700/66 |
| 2010/0299945 A1* | 12/2010 | Lacy | G01B 21/047 33/503 |
| 2011/0184695 A1* | 7/2011 | Grzesiak | 702/167 |
| 2011/0268322 A1* | 11/2011 | Clausen et al. | 382/106 |
| 2012/0154576 A1* | 6/2012 | Weston et al. | 348/136 |
| 2015/0219451 A1* | 8/2015 | Pettersson | G01B 5/008 33/503 |

OTHER PUBLICATIONS

Zainuddin et al. ("From Laser Point Cloud to Surface: Data Reduction Procedure Test", Geoinformation Science Journal, 2009, pp. 1-9).*

Bliek, "Geometric Inspection of Small Components with CT-Scanners", InnovMetric Software, 7 pages, retrieved from the Internet May 2012.

"Exploit a 3D Dimensioning Analysis," Application Software for Analysis and Visualization of Industrial Computer Tomography/Voxel Data, Volume Graphics, 26 pages, Apr. 2010.

"VGStudio MAX 2.1," Volume Graphics, 8 pages, 2010.

"Visualization Technology at its Best, VGStudio MAX," 3DScanning Technologies, 2 pages, vol. 1, No. 3,Dec. 2008.

"Exploit a 3D Nominal/Actual Comparison," Application Software for Analysis and Visualization of Industrial Computer Tomography/Voxel Data, Volume Graphics, 21 pages, Apr. 2010.

Supplementary European Search Report from European Patent Application No. EP 12 82 0824 dated Jan. 30, 2015.

International Preliminary Report on Patentability and Written Opinion for International Application No. PCT/US2012/048522 dated Feb. 4, 2014.

Extended Supplementary European Search Report for International Application No. EP 12820824 dated Jan. 30, 2015.

Gong, Study of CMM Automatic Measurement Technology Based on Quasi-CAM Model. Chinese Excellent Master's theses. Text Database. Engineering Technology. Mar. 15, 2009;3:C030-12.

He, Key Technological Research on Processing of Scattered Point Clouds China Doctor Dissertation. Text Database, Information Technology Edition. Jun. 15, 2008;6:1138-46.

* cited by examiner

COORDINATE MEASURING SYSTEM DATA REDUCTION

RELATED APPLICATION

This application claims the benefit under 35 U.S.C. §119 of U.S. Provisional Application Ser. No. 61/513,451, filed Jul. 29, 2011, entitled "Coordinate Measuring System Data Reduction", which is hereby incorporated by reference in its entirety.

FIELD OF INVENTION

This invention relates generally to coordinate measuring systems, and more specifically to apparatuses and methods for systematically reducing data collected by coordinate measuring machines, including non-tactile coordinate measuring machines.

DESCRIPTION OF THE RELATED ART

Coordinate measuring machines (CMMs) are in common use for dimensional inspection of workpieces. Typically, a workpiece is secured to a table, and a probe, such as one using a touch sensor, is moved in three dimensions on an arm of the CMM within a measurement volume to contact the workpiece at various points. When the probe contacts the workpiece, measuring scales in the x, y and z directions are read to obtain the position coordinates of the contacted point on the workpiece. By contacting various points on the workpiece, measurements of workpiece features can be obtained.

Non-tactile measuring systems, such as scanning CMMs, vision systems, and micro-CT radiate light or other types of radiation toward a workpiece and sense the reflected or transmitted radiation as part of determining the surface structure of the workpieces. For example, in some scanning CMMs, a laser line scanner emits light toward a workpiece surface and returns a stream of measured surface points along its path of motion. This process may be repeated in multiple paths/passes across a workpiece collecting thousands or millions of scan points across the workpiece surface. Typically, a large amount of point data is generated for a scanned workpiece, and this set of data is often referred to as a point cloud.

SUMMARY

According to one embodiment of the invention, a computer-implemented method includes receiving coordinate measurement data associated with a measurement of a physical object, and operating a computer-implemented system to segment the coordinate measurement data into two or more data sets based on distinct geometric features of the object, the geometric features having been identified using nominal geometric information from an electronic file containing nominal geometric information for an object that corresponds to the physical object. The method further includes operating a computer-implemented system to reduce the coordinate measurement data in a first data set of the two or more data sets to a first reduced data set in a first manner, and operating a computer-implemented system to reduce the coordinate measurement data in a second data set of the two or more data sets to a second reduced data set in a second manner, different from the first manner.

According to another embodiment of the invention, a computer-implemented method includes using a computer-implemented system to receive geometric feature data originating from an electronic file containing nominal geometrical information for an object, the geometric feature data including a tolerance for one or more geometric features. Also included is an act of using a computer-implemented system to define a data segmentation volume associated with a first geometric feature of the object by establishing boundaries of the data segmentation volume, including establishing a first boundary of the data segmentation volume based at least in part on the received tolerance for the first geometric feature.

According to a further embodiment of the invention, a computer-implemented method includes using a computer-implemented system to receive geometric feature information originating from an electronic file containing nominal geometric information for an object, and using a computer-implemented system to define a first data segmentation volume associated with a first geometric feature of the object and a second data segmentation volume associated with a second geometric feature of the object. The method also includes transforming coordinate measurement data of a physical object to a coordinate system of the electronic file, the coordinate measurement data comprising a plurality of data points. Further includes in the method are acts of designating data points which are located within the defined first data segmentation volume as being associated with the first geometric feature, and designating data points which are located within the defined second data segmentation volume as being associated with the second geometric feature.

According to yet another embodiment of the invention, a computer-implemented method includes receiving an identification of a type of geometric characteristic to be inspected on a geometric feature, the identification of the type of geometric characteristic having originated from a computer model which includes the geometric feature. A further act includes receiving coordinate measurement data associated with a measurement of a physical geometric feature that corresponds to the geometric feature of the computer model. A computer-implemented system is used to determine an algorithm for reducing the coordinate measurement data, wherein the determination of the algorithm is based at least in part on the identified type of the geometric characteristic to be inspected.

According to another embodiment of the invention, a computer-implemented method includes receiving tolerance information for a geometric characteristic to be inspected on a geometric feature, and receiving coordinate measurement data associated with a measurement of the physical feature. The method also includes using a computer-implemented system to determine an algorithm for reducing the coordinate measurement data, wherein the determination of the algorithm is based at least in part on the tolerance information for the geometric characteristic.

According to a further embodiment of the invention, at least one computer-readable medium storage device has computer-readable instructions for performing steps of a method of segmenting and reducing coordinate measurement data, the method including receiving coordinate measurement data associated with a measurement of a physical object, and operating a computer-implemented system to segment the coordinate measurement data into two or more data sets based on distinct geometric features of the object, the geometric features having been identified using data from an electronic file containing nominal geometric data for an object which corresponds to the physical object. The method also includes operating a computer-implemented system to reduce the coordinate measurement data in a first data set of the two or more data sets to a first reduced data set in a first manner. The method further includes operating a computer-implemented system to reduce the coordinate measurement data in a second data set of the two or more data sets to a second reduced data set in a second manner, different from the first manner.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

This disclosure recognizes the importance of applying data reduction techniques to point cloud data in an automated, systematic manner using existing nominal geometric data as a guide, such as data from a Computer-Aided Design (CAD) model or a standard CMM inspection plan. The ability to reduce point cloud data can be particularly beneficial when scanning objects with a non-tactile measuring instrument. In some embodiments disclosed herein, to reduce point cloud data generated by a scanner, data reduction is performed on a feature-by-feature basis through reference to a computer model of a nominal object. In some embodiments, user input is permitted to adjust, select, refine, and/or set parameter values for an automated reduction algorithm.

Non-tactile measuring instruments typically are able to produce coordinate measurement data more quickly than traditional contact CMMs because fewer moving parts are used. As a result, large quantities of data often can be generated by a non-tactile measuring instrument in a short amount of time. The large amount of data, often referred to as a point cloud, can aid in producing accurate and precise data definitions of inspected objects, but the sheer quantity of data can also be problematic. For example, storing, communicating and processing the point cloud data can be time consuming or impractical, thereby resulting in overall process inefficiencies. Further, memory and communication speed requirements to handle the data may necessitate costly implementations or upgrades of hardware and/or software components. These limitations may present difficulties if analysis of point cloud data is desired for statistical process control, or for other process-oriented purposes.

Point cloud data reduction can help reduce the data burden associated with scanning technologies. Various data reduction techniques exist, such as filtering, smoothing, and decimation, among others. Typically these techniques are applied to an entire dataset to reduce the overall amount of data. Applying such techniques to an entire data set of a scanned object may excessively reduce data for some portions of the data set, thereby unacceptably eroding the accuracy or precision of the resulting data. Or, in some cases, the maximum permitted data reduction in consideration of accuracy or precision requirements may not sufficiently pare the data for practical data management or processing.

According to some embodiments of the invention, point cloud data is reduced in a strategic and systematic manner by segmenting the data set based on an object's geometric features and/or tolerances. For example, in one embodiment, a software application is used to identify various geometric features of a CAD model of an object, and then create a data segmentation volume for each geometric feature. The various data segmentation volumes may be assigned different data extraction requirements based on one or more parameters, such as: the type of feature, the identified geometric characteristic to be inspected, the tolerance set forth in the CAD model, and/or other suitable parameters.

After a physical workpiece of the object is manufactured and scanned, the resulting point cloud data may be aligned with the nominal CAD model, and the data points which reside within a data segmentation volume are assigned to that data segmentation volume. The data in each data segmentation volume then may be reduced in a manner which meets the assigned data requirements. The particular manner of data reduction may be determined by one or more parameters, and the data reduction algorithms may differ among data segmentation volumes associated with the same object. In this manner, point cloud data may be reduced or strategically specified on a feature-by-feature basis to meet the data requirements for each specific feature. In some embodiments, this feature-by-feature reduction may be performed in an automated or a semi-automated fashion.

For example, a software application according to one embodiment of the invention may analyze a CAD model of an object and categorize two identified features into two feature types, namely a plane feature type and a cylinder feature type. Once a physical object is formed and scanned with a 3D scanner, portions of the resulting point cloud data can be segmented into two data sets based on this feature categorization. In some embodiments, data segmentation volumes are established through use of a programmed algorithm which uses information from the CAD model. Each of the two data sets then may be reduced in a different manner. The subset of the point cloud data in the area of the plane feature is reduced based on its categorization as a plane and optionally on one or more other parameters such as GD&T callout type and tolerance. In the area of the cylinder feature, the data may be reduced in a manner different from the data reduction manner used for the plane feature. As one example, the plane feature data quantity may be uniformly reduced over its whole area by 75% and/or involve the use of a certain type of data filtering, while the cylinder feature data quantity may be reduced by 50% and/or involve the use of a certain type of data filtering. The reduction percentage is not the only aspect that may vary between the resulting reduced data sets of two or more features. For example, the reduced data set associated with the plane feature may include a substantially evenly geometrically distributed set of data points, while the cylinder feature data may be reduced such that data points are densely populated along cross-sectional profiles at strategically specified distances along the length of the cylinder.

In this manner, point cloud data can be reduced in a targeted fashion so that sufficient data remains for each area or feature of a scanned object without undue amounts of superfluous coordinate measurement data being maintained for some or all of the object's areas or features. Efficient reduction of the point cloud data can be particularly important when CMMs are used to inspect manufactured workpieces. Timely results can aid in confirming part compliance or discovering manufacturing errors for use as feedback to the manufacturing process.

For purposes herein, the terms "data reduction", "reducing data", "point cloud reduction", and other associated terms are intended to encompass acts, methods and systems in which a subset of data is extracted from a larger data set. For example, if 10% of the data points from a point cloud are selected and used for analysis, storage, display and/or other purposes, such an act would be considered data reduction, even if the remaining 90% of data points are not expressly deleted.

While embodiments are described herein with reference to point clouds and coordinate measurement data originating from non-tactile measuring instruments, in some embodiments methods and systems described herein may be used with coordinate measurement data originating from contact coordinate measuring machines.

Figure 1:
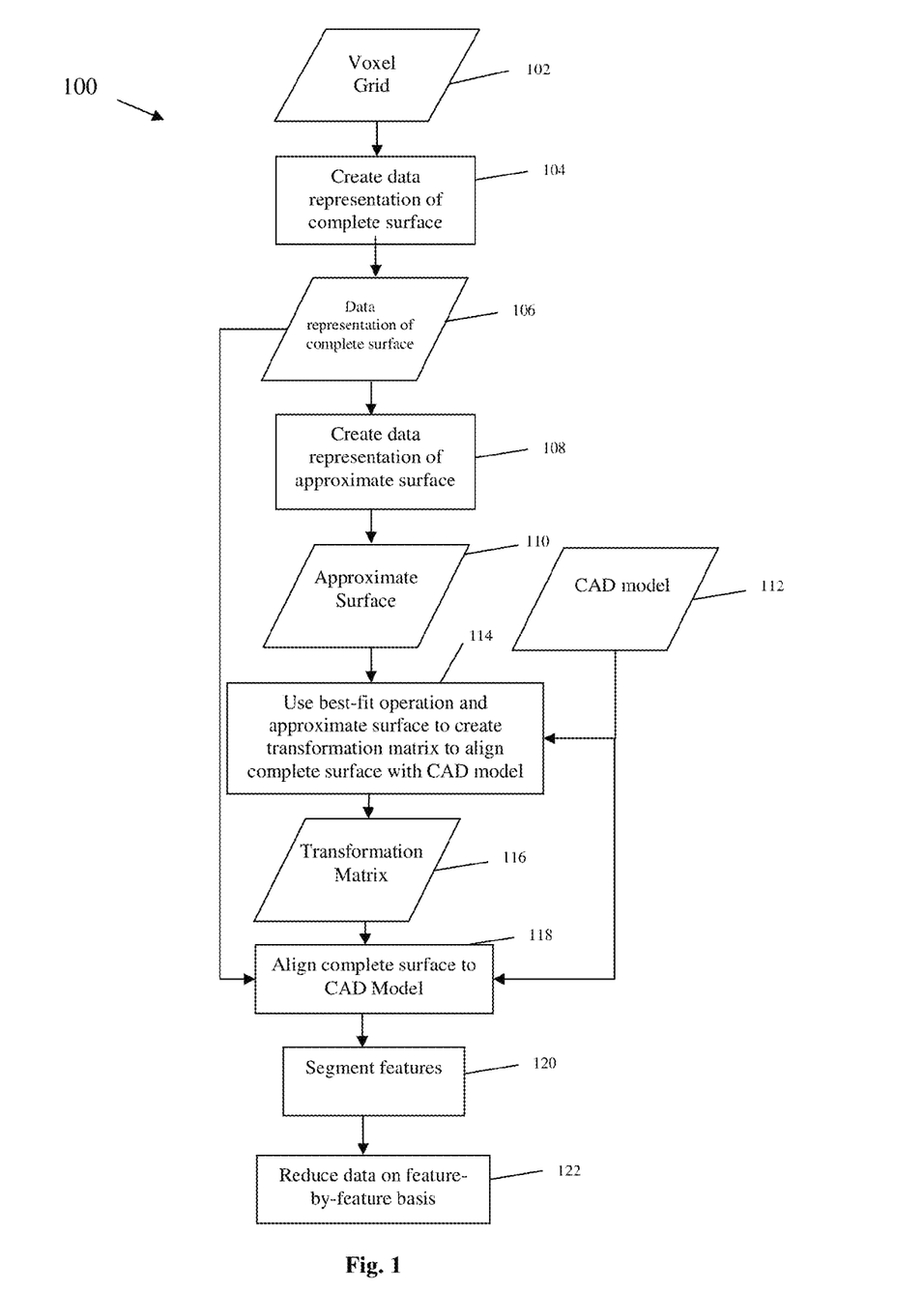
FIG. 1 is a flow chart representative of a method for managing coordinate measurement data, according to one embodiment.

According to one embodiment of the invention, a method 100 of managing coordinate measurement data includes segmenting and/or reducing data based on features determined using a CAD model. Three dimensional measurement data may be contained in a voxel grid 102, from which a point cloud of surface data points may be later extracted. Of course, other suitable formats for storing and/or displaying coordinate measurement data may be used with embodiments disclosed herein. The data in the voxel grid may be measured as part of method 100, may be retrieved from a computer storage device, and/or may be received from a third party. For purposes herein, the term "receive" as it relates to data and information is meant to include receipt from a third party, receipt from an external computer system, receipt by one portion of a computer system from another portion of the same computer system, and generation of the data or information within the computer system which receives the data. In effect, receiving data or information includes any suitable provision of the data or information to the entity(ies) performing the acts of a method.

Typically, each voxel will contain a point location $\{x, y, z\}$ and an intensity value $\{I\}$, though other arrangements are possible. In an act 104, a data representation of a complete surface 106 is created using the voxel grid. The surface data may be represented by point locations with normal vectors, i.e., $\{x, y, z, i, j, k\}$.

In preparation for aligning the surface data with a CAD model 112 or other electronic file containing nominal geometric information, a data representation of an approximate surface 110 may be created in an act 108 by reducing the data in the complete surface data representation. For example, decimation techniques may be used to reduce the entire data set of the complete surface to create an approximate surface that is sufficient for an initial best-fit operation to align the measured surface data to the CAD model 112. A best-fit operation (act 114) then may be performed to arrive at a transformation matrix 116 which aligns the surface data to the CAD model 112 by transforming the coordinate system of the surface data to the coordinate system of the CAD model. Typically, a least-squares method may be used as part of the best-fit operation, though other suitable methods may be used. The transformation matrix 116 then may be used to align the data representation of the complete surface to the CAD model 112 (act 118).

In some embodiments, the intervening acts associated with creating a data representation of an approximate surface are not performed. That is, a best-fit operation may be performed directly on the complete surface data representation without first determining a transformation matrix based on an approximate surface. For purposes herein, transforming a coordinate system of coordinate measurement data to the coordinate system of a CAD model is intended to include a transformation of a coordinate system of a CAD model to a coordinate system of coordinate measurement data. Such a transformation is intended to include any operation which results in at least an approximate alignment of the coordinate measurement data to the CAD model (or other electronic model or file containing geometric information). For purposes herein, transformation of a coordinate measurement system is intended to include a translation and/or rotation of a coordinate measurement system, as well as a transformation from one type of coordinate measurement system to another (e.g., from spherical coordinates to Cartesian coordinates).

In an act 120, the data representation of the complete surface 106 is segmented into data sets based on features identified through use the CAD model. For example, a CAD model of a physical object may be analyzed and a number of distinct geometric features may be identified. In act 120, the surface data derived from the coordinate measurement data is divided into data sets with each data set corresponding to one of the identified geometric features. Subsets of the data sets may grouped together within a category of geometric features. For example, two or more of the identified geometric features may be identified as planes, and the two associated data sets may be grouped together in a plane category. Any suitable number of categories may be established or defined. For example, two, three, four, six, seven features, or any number of features greater than seven may be identified and associated with a same number of categories or a different number of categories. The identification of the geometric features in the CAD model may be performed prior to initiation of method 100, or may be performed at any suitable time during act 100. The analysis of the CAD model (or other electronic model) may be performed by a pre-defined algorithm that searches for shapes, areas, edges, and/or other attributes of the CAD model to identify types of geometric features. In some embodiments, a user may be prompted to enter values to set parameters, and/or a user may be prompted to select from a list of identification algorithms. In such embodiments, the segmentation is still considered to be the use of a pre-defined algorithm.

To prompt and/or receive a user's selection of parameter values, algorithms and/or other selections, dialog boxes may be presented to the user. In some embodiments, drop down menus, readable files, or selectable tables may be used, and in still further embodiments, users may be permitted to directly enter values.

A data segmentation volume may be created for each identified geometric feature to define which data points of the coordinate measurement data to associate with the identified geometric feature. The data points contained within each data segmentation volume then may be reduced. The boundaries of each data segmentation volume may be set using at least in part geometric dimensioning and tolerance (GD&T) information contained with the CAD model in some embodiments. For example, data points associated with the coordinate measurement of a plane of course will not be exactly co-planar with one another, that is, some points will lie in front of the nominal plane and some points will lie behind the nominal plane. To determine the boundaries of inclusion of data points which lie behind or in front of the nominal plane, geometric tolerance and dimension information from the CAD model may be used. Further detail regarding examples of establishing data segmentation volumes are discussed further below with reference to FIGS. 4a and 4b.

Each of the data sets may be reduced in a manner specific to the feature corresponding to the data set (act 122). For example, a first data set corresponding to a first feature may be reduced using triangular decimation at a specified percentage rate or specific number of vertices, while a second data set corresponding to a second feature may be reduced using the same triangular decimation algorithm but specify a maximum deviation or minimum angle between neighboring facets. A third data set corresponding to a third feature may be reduced using a Gaussian filter to remove outliers outside some N number of standard deviations. A fourth data set may be reduced by uniform interpolation over its surface by specifying the spacing between points, or points per unit area. A fifth data set may be reduced by strategically extracting uniformly spaced points along specified cross-sectional profiles at different locations or angular positions along a feature. A sixth data set may be reduced by strategically extracting specific surface point locations from user-defined nominal points and vectors intersecting the actual surface. Lastly, a seventh data set may not be reduced at all. Of course the above example is not intended to be limiting as other types of data reduction may be used for various features.

Figure 2:
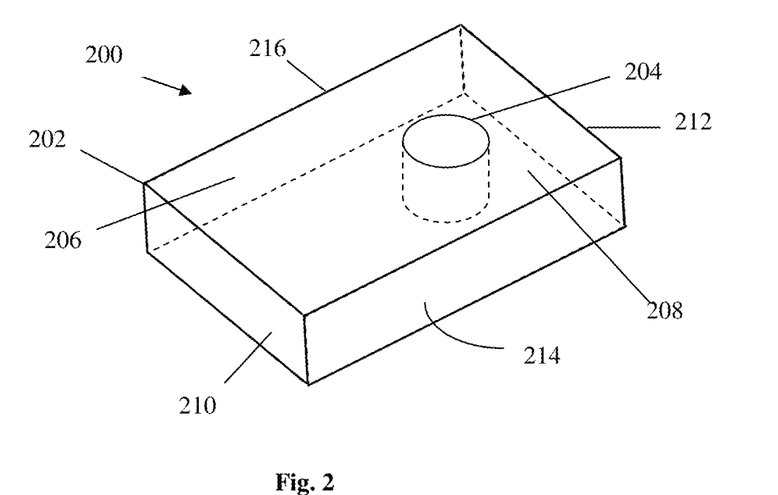
FIG. 2 is an isometric view of a CAD model of an object.
Figure 3:
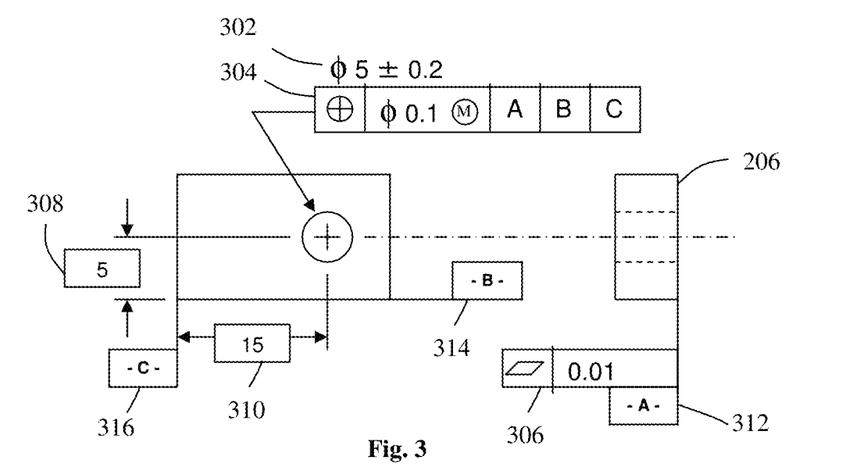
FIG. 3 is a schematic drawing showing one example of geometric dimensioning and tolerance information contained within the CAD model of FIG. 2.

Turning now to one example of a particular application of the methods and apparatuses disclosed herein, FIG. 2 shows an isometric view of a CAD model of an object 200 composed of a rectangular prism 202 with a cylindrical bore 204. Rectangular prism 202 includes a top planar surface 206, a bottom planar surface 208, a front planar surface 210, a rear planar surface 212 and two side planar surfaces 214, 216. A two-dimensional layout of the object is shown in FIG. 3 along with GD&T information. The GD&T information of this CAD model includes various callouts for features of interest, including basic dimensions and control frames. The CAD model also includes datum features. As discussed further below with reference to FIGS. 4a and 4b, this GD&T information, in some cases in conjunction with user inputs, is used to define sectioning boundaries which enclose a subset of data points from a coordinate measurement data point cloud. The point cloud (or other suitable set of data points) is generated through coordinate measurement of a corresponding physical object.

FIG. 3 includes three callouts, namely a size dimension 302 defining the diameter of a cylindrical bore, and two feature control frames 304, 306. Feature control frame 304 provides information regarding the position of the cylindrical bore relative to the datum features labeled "-A-", "-B-" and "-C-". The "M" after the "0.1" position tolerance indicates that there is extra allowance for error as the bore's size increases, therefore more data on the cylinder surface about its diameter may be beneficial in determining extra allowance in the tolerance evaluation. Feature control frame 306 provides information regarding a desired flatness of top planar surface 206. Basic dimensions 308 and 310 provide the location of the center of cylindrical bore 204 relative to a front edge of prism 200. Datum features, which in this example include datum planes 312, 314 and 316, are also provided within the CAD model.

Figure 4A:
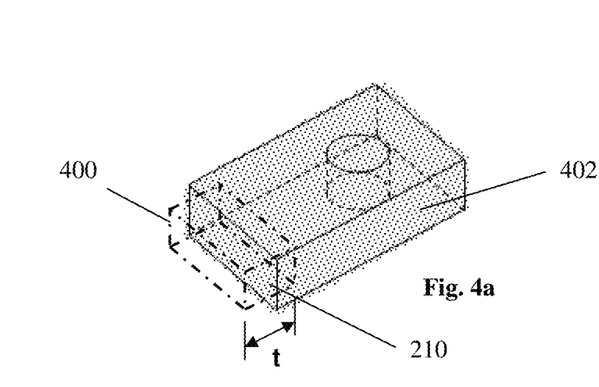
FIG. 4a is an isometric view of coordinate measurement data superimposed on the CAD model of FIG. 2, and a data segmentation volume.
Figure 4B:
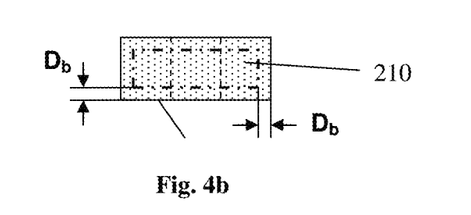
FIG. 4b is a front plan view of the CAD model, the superimposed coordinate measurement data and the data segmentation volume of FIG. 4b.

From the CAD model and the GD&T information, boundaries may be constructed to define a data segmentation volume for each of various features of the object. The data contained within these data segments then can be reduced based on the type of feature and/or other parameters. For example, as shown in FIGS. 4a and 4b, a segmentation volume 400 is shown enclosing coordinate measurement data points 402 associated with front planar surface 210.

Figure 5:
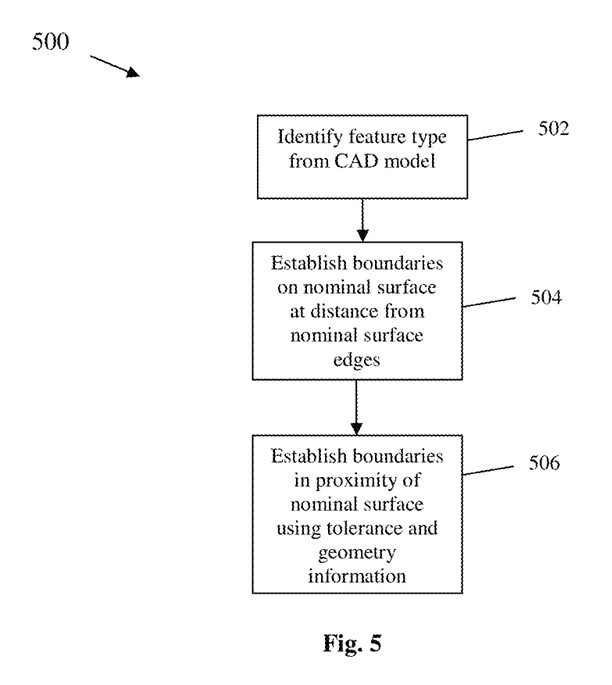
FIG. 5 is a flow chart representative of a method for segmenting coordinate measurement data, according to one embodiment.

According to one embodiment of the invention, a method 500 may be used to create one or more data segmentation volumes through use of the CAD model. In some embodiments, method 500 may be a computer-implemented method, and may or may not include prompts for user input. Method 500 described herein is one example of a method of performing act 120 of method 100 described above with reference to FIG. 1. However, other suitable methods for performing act 120 may be used, and method 500 may be used in methods other than method 100.

In an act 502, one or more geometric feature types are identified from the CAD model. This identification may be performed by a software application programmed to process CAD model data and locate geometric features. In some embodiments, a data segmentation volume may not be established for all identified features. For example, the software program may include instructions to not establish data segmentation volumes for certain geometric feature types. Examples of geometric feature types include: planes, cylinders, cones, spheres, ellipses, etc., as well as other, complex free-formed surfaces composed of higher order equations between surface points.

As one example of establishing a data segmentation volume, for a given identified datum surface, boundaries may be set along the datum surface by defining boundaries inwardly of the nominal surface edges by a clearance distance (act 504) to avoid inclusion of data points that are over the edges. For example, segmentation volume 400 is spaced inwardly from the edges of front planar surface 210 by a clearance distance $D_b$. The upper and lower boundary surfaces are set at clearance distance $D_b$ from top planar surface 206 and bottom planar surface 208. Likewise, the side boundary surfaces are set at clearance distance $D_b$ from side planar surfaces 214, 216. $D_b$ may be set at a default value for distance from edges defined in the CAD model. Or, in some embodiments, clearance distance $D_b$ may be calculated based on various values contained within the model, such as tolerances set forth in the CAD model, and/or the dimensions of the planar surface. Segmentation volumes may have different clearance distances along different edges, and of course segmentation volumes may have clearance distances which differ from other segmentation volumes within the same CAD model. In some embodiments, one or more clearance distances may be based at least in part on the precision and/or point density of the coordinate measurement data. As will be apparent to one of skill in the art, data segmentation volumes are not necessarily displayed or explicitly defined as a volume. For example, each of the boundaries of a data segmentation volume may be defined mathematically or defined by a series of points which establish a line, plane, or other surface. In some embodiments, a data segmentation volume may not include boundaries which form a closed volume in the sense that in some areas or directions, any measured data points would be included in the data segmentation volume.

A tolerance band t also may be established to define boundaries for encompassing coordinate measurement data points that are in front of or behind the nominal datum surface defined in the CAD model (act 506). A value for the tolerance band may be set by using a multiple of the feature tolerance set forth in the CAD model, or by using a default tolerance band value, or by using a specific tolerance band value input by a user. Different default tolerance band values may correspond to different feature types in some embodiments. For example, the depth of data segmentation volume 400 may be set as a tolerance band based on a multiplier of two of the tolerance defined in the CAD model for datum plane C 316 (0.01 mm), resulting in a tolerance band t having a depth of 0.02 mm.

A chart of examples of values for tolerance bands and clearance distances is shown in Table 1. In cases where a feature type does not typically include tolerances, or a tolerance is not provided by the CAD model, a tolerance band default value may be used. Tolerance values may be provided by computer models or other electronic files other than CAD models. For example, in some embodiments, tolerance information may be contained in or input to a computer file, and the tolerance information may be assigned to various geometric features. Clearance distances from surface edges may be preset at a specified distance, and the particular values may vary based on the feature type. In some embodiments, the clearance distances may be set based on values such as the size of the feature or certain tolerance information provided in the CAD model.

TABLE 1

| Feature Type | Tolerance multiplier (override tolerance default) | Tolerance default | Clearance distance from surface edges ($D_b$) |
|---|---|---|---|
| Plane (Datum-A-) | 2 × 0.01 = 0.02 mm | 0.05 mm | 0.5 mm |
| Plane (all others) | 2 × {tolerance not found} | 0.05 mm | 0.5 mm |
| Cylinder | 2 × 0.2 = 0.4 mm | 0.05 mm | 0.5 mm |
| Cone | 3 × {tolerance not found} | 0.05 mm | 0.5 mm |
| Sphere | 2 × {tolerance not found} | 0.05 mm | 0.5 mm |
| Free-formed | 3 × {tolerance not found} | 0.05 mm | 0.5 mm |

Note:
Bold values indicate those that would be applied to features depending on information available in the CAD model for those features Technodigit, PC-DMIS®, available from Wilcox Associates, Inc., and QUINDOS®, available from Hexagon Metrology GMBH, though any suitable data reduction program may be used. Technodigit's 3D Reshaper software can uniformly reduce data through triangular decimation and Gaussian filter algorithms. 3D Reshaper can also strategically extract points along profiles at sectioned locations in a geometric feature. PC-DMIS® and QUINDOS® software both have a wide range of filtering options as well as the ability to strategically extract points at nominal locations, as do many other CMM inspection software packages in the industry.

For example, for a callout of flatness, a target point density of nine points per square millimeter may be defined if the tolerance is less than or equal to 0.005 mm. If the tolerance is greater than 0.005 mm and less than or equal to 0.050 mm, the target point density may be set to 4 points per square millimeter. In cases where the tolerance is greater than 0.050 mm, the target point density may be set to 1 point per square millimeter. Table 2 shows one example of a chart of point density and/or point arrangement based on the type of measurement, the type of callout, and the tolerance range into which the associated tolerance falls.

TABLE 2

| Callout Name | Reduction Method | 1st tolerance range ≤0.005 mm | 2nd tolerance range >0.005 ≤0.050 mm | 3rd tolerance range >0.050 mm |
|---|---|---|---|---|
| Flatness | Uniform Interpolation | 9 pt/mm² | 4 pt/mm² | 1 pt/mm² |
| Roundness | Strategic Extraction | section@height = h, 300 pt/rev | section@height = h, 100 pt/rev | section @height = h, 50 pt/rev |
| Cylindricity | Strategic Extraction | #steps = N between $h_0$ and $h_{max}$ 300 pt/rev | #steps = N between $h_0$ and $h_{max}$ 100 pt/rev | #steps = N between $h_0$ and $h_{max}$ 8 pt/rev |
| Profile | Triangular Decimation | No reduction performed | Deviation limit = 0.001 mm | Deviation limit = 0.005 mm |
| Total Runout | Triangular Decimation | No reduction performed | Deviation limit = 0.001 mm | Deviation limit = 0.005 mm |
| Diameter | Strategic Extraction and Gauss Polar Filter | 10 pt/mm, steps = N between $h_0$ and $h_{max}$ | 100 pt/rev, Gauss Filter = 50 cc/rev | 100 pt/rev, Gauss Filter = 50 cc/rev |
| Position/Location | Strategic Extraction | Specified nominal vector points: x, y, z, i, j, k | Specified nominal vector points: x, y, z, i, j, k | Specified nominal vector points: x, y, z, i, j, k |

Once boundaries have been set to define data segmentation volumes for data points, the data included within each segmentation volume may be reduced in a manner specific to the feature type, and/or specific to one or more other parameters such as a tolerance set forth in the CAD model. For each data segmentation volume, the corresponding target point density may be input to a known data reduction program which then reduces the data to the target point density. In this manner, coordinate measurement data may be reduced in a manner targeted to the data needs for each type of feature. In some embodiments, the segmentation and/or reduction may be performed in an automated fashion. Examples of known data reduction programs include 3D Reshaper, available from The above embodiment includes the use of a CAD model for access to nominal geometric data, however other types of electronic files which contain nominal geometric information may be used with embodiments disclosed herein, either independent of, or supplemental to, information provided by a CAD model.

Figure 6:
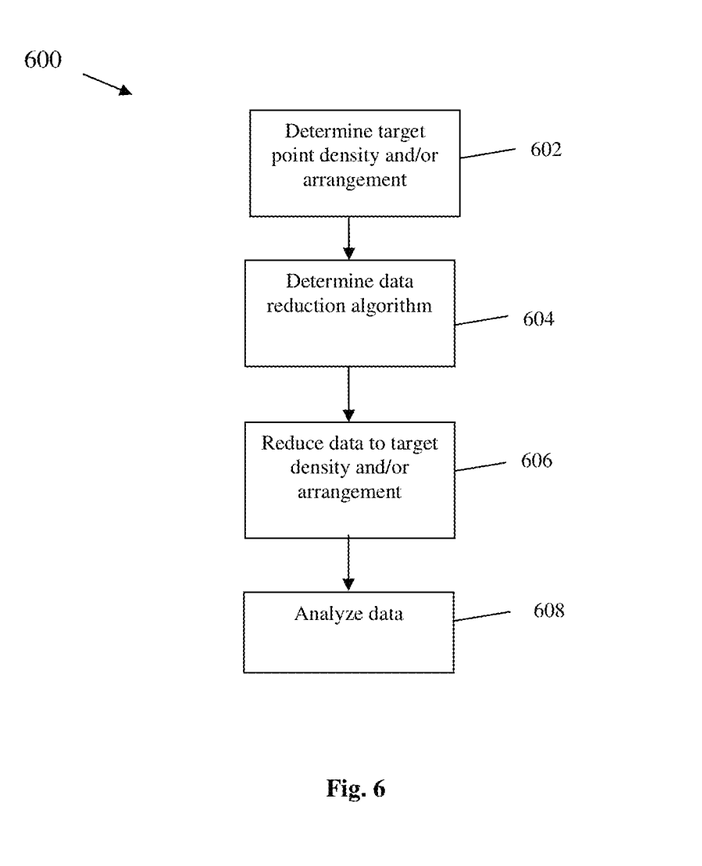
FIG. 6 is a flow chart representative of a method for reducing coordinate measurement data, according to one embodiment.

One example of a method 600 of reducing and analyzing data contained within a data segmentation volume is shown in FIG. 6. Not all of the acts shown in FIG. 6 necessarily need to be performed to reduce and/or analyze coordinate measurement data. In an act 602, a target data point density and/or data point arrangement is determined. The determination may be based on the type of feature being analyzed, the type of callout specified, and/or a tolerance or other piece of GD&T information. This determination may be implemented through use of a lookup table, such as the example shown in Table 2.

A type of data reduction algorithm is determined in an act 604. Act 604 may include an analysis of the target point density and/or arrangement which was determined in act 602. For example, in act 604, the existing data point density from a point cloud may be compared to the target point density determined in act 602, and a particular data reduction scheme (decimation, smoothing, etc.) may be selected based on this comparison. In some embodiments, the same type of data reduction algorithm may be used for each data segmentation volume, but particular parameters within the data reduction algorithm may be determined based on the target point density and/or GD&T information.

The coordinate measurement data is reduced in an act 606.

The reduced data, which may be more amendable to analysis due to the lessened data handling requirements, may be analyzed in any suitable manner in an act 608. For example, the flatness of a plane, or the length of a geometric feature may be calculated and compared to the CAD model or other standard. Such analyses may be implemented as part of a quality analysis/quality control program or as part of any other process involving the measurement and analysis of objects.

Figure 7:
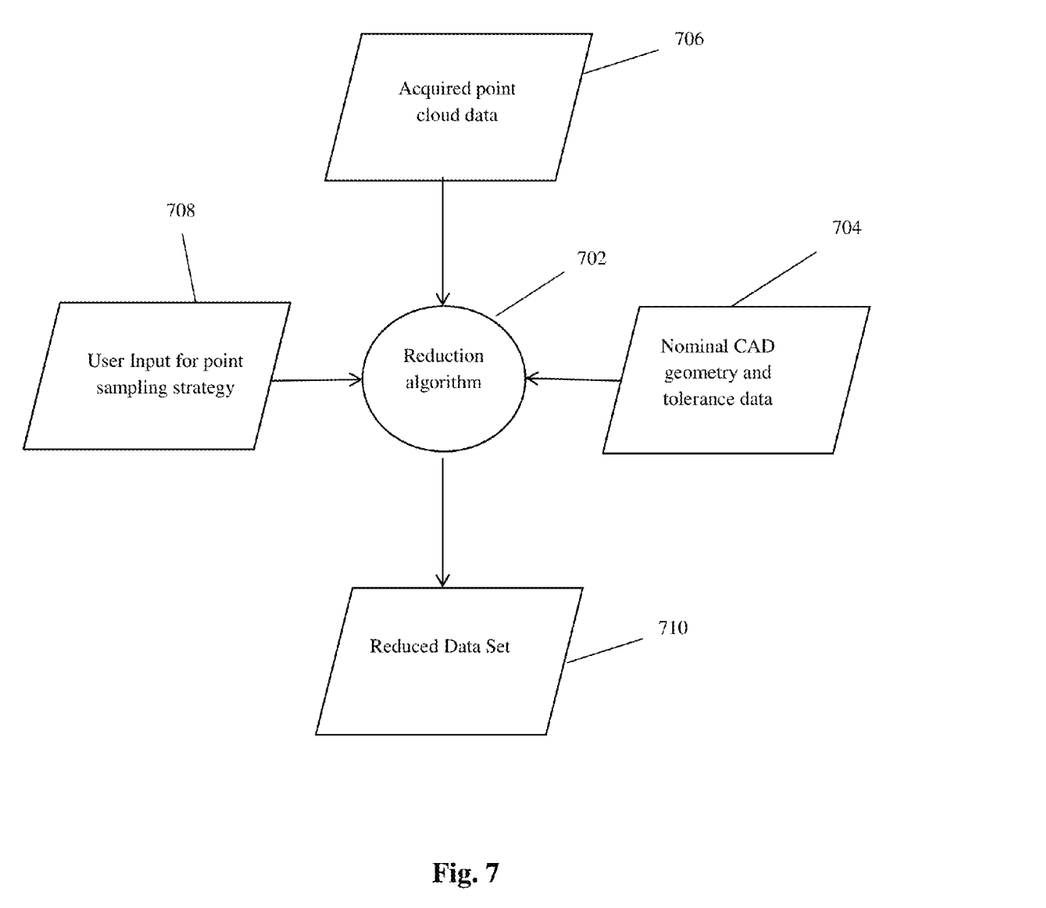
FIG. 7 is a data flow chart representative of a method for reducing coordinate measurement data.

FIG. 7 shows a data flow chart representative of various embodiments described herein. A pre-defined reduction algorithm 702 receives an electronic file, or data therefrom, such as a nominal CAD geometry and tolerance data 704. Algorithm 702 also receives acquired point cloud data 706. Point cloud data 706 may be data from a non-contact CMM, a contact CMM, or other measurement device. The point cloud data may be received directly from a CMM, or may be received from a data file, or any other suitable source. User input also may be received by reduction algorithm 702, such as user input for a point sampling strategy 708. For purposes herein, an algorithm is considered to be pre-defined even if the algorithm is selected from a set of possible algorithms. Further, user inputs to the pre-defined algorithm do not necessarily render the algorithm no longer pre-defined.

Using the nominal CAD geometry and tolerance data 704, the point cloud data 706 and the user input for a point sampling strategy 708, reduction algorithm 702 reduces the point cloud data to a reduced data set 710 that is more easily managed and analyzed.

The above-described embodiments can be implemented in any of numerous ways. For example, the embodiments may be implemented using hardware, software or a combination thereof. When implemented in software, the software code can be executed on any suitable processor or collection of processors, whether provided in a single computer or distributed among multiple computers.

Further, it should be appreciated that a computer may be embodied in any of a number of forms, such as a rack-mounted computer, a desktop computer, a laptop computer, or a tablet computer. Additionally, a computer may be embedded in a device with suitable processing capabilities, including a Personal Digital Assistant (PDA), a smart phone or any other suitable portable or fixed electronic device.

Also, a computer may have one or more input and output devices. These devices can be used, among other things, to present a user interface. Examples of output devices that can be used to provide a user interface include printers or display screens for visual presentation of output and speakers or other sound generating devices for audible presentation of output. Examples of input devices that can be used for a user interface include keyboards, and pointing devices, such as mice, touch pads, and digitizing tablets. As another example, a computer may receive input information through speech recognition or in other audible format.

Such computers may be interconnected by one or more networks in any suitable form, including as a local area network or a wide area network, such as an enterprise network or the Internet. Such networks may be based on any suitable technology and may operate according to any suitable protocol and may include wireless networks, wired networks or fiber optic networks.

Also, the various methods or processes outlined herein may be coded as software that is executable on one or more processors that employ any one or more of a variety of operating systems or platforms. Additionally, such software may be written using any of a number of suitable programming languages and/or programming or scripting tools, and also may be compiled as executable machine language code or intermediate code that is executed on a framework or virtual machine.

In this respect, embodiments of the invention may be embodied as a computer-readable storage medium or multiple computer-readable media encoded with one or more programs that, when executed on one or more computers or other processors, perform methods that implement the various embodiments of the invention discussed above. Computer readable media may include, for example, a computer memory, one or more floppy discs, compact discs (CD), optical discs, digital video disks (DVD), magnetic tapes, flash memories, circuit configurations in Field Programmable Gate Arrays or other semiconductor devices, or other tangible computer storage medium. As is apparent from the foregoing examples, a computer readable storage medium may retain information for a sufficient time to provide computer-executable instructions in a non-transitory form. Such a computer readable storage medium or media can be transportable, such that the program or programs stored thereon can be loaded onto one or more different computers or other processors to implement various aspects of the present invention as discussed above. As used herein, the term "computer-readable storage medium" encompasses only a computer-readable medium that can be considered to be a manufacture (i.e., article of manufacture) or a machine. Alternatively or additionally, the embodiments of the invention may be embodied as a computer-readable medium other than a computer-readable storage medium, such as a propagating signal.

The terms "program" or "software" are used herein in a generic sense to refer to any type of computer code or set of computer-executable instructions that can be employed to program a computer or other processor to implement various aspects of the present invention as discussed above. Additionally, it should be appreciated that according to one aspect of this embodiment, one or more computer programs that when executed perform methods of embodiments of the present invention need not reside on a single computer or processor, but may be distributed in a modular fashion amongst a number of different computers or processors to implement various aspects of embodiments of the present invention.

Computer-executable instructions may be in many forms, such as program modules, executed by one or more computers or other devices. Generally, program modules include routines, programs, objects, components, data structures, etc. that perform particular tasks or implement particular abstract data types. Typically the functionality of the program modules may be combined or distributed as desired in various embodiments.

The phrase "and/or," as used herein in the specification and in the claims, should be understood to mean "either or both"

of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or' shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

It should also be understood that, unless clearly indicated to the contrary, in any methods claimed herein that include more than one step or act, the order of the steps or acts of the method is not necessarily limited to the order in which the steps or acts of the method are recited.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A method comprising:
   operating a coordinate measuring machine to measure a physical object to generate coordinate measurement data from the physical object;
   operating a computer-implemented system to identify first and second distinct geometric features of the object using a CAD model containing nominal geometric information for an object that corresponds to the physical object;
   operating a processor to segment the coordinate measurement data into two or more data sets, a first data set of the two or more data sets being associated with the first distinct geometric feature of the object, a second data set of the two or more data sets being associated with the second distinct geometric feature of the object, the geometric features having been identified using the nominal geometric information from the CAD model;
   operating a processor to reduce the coordinate measurement data in the first data set of the two or more data sets to a first reduced data set in a first data reduction manner associated with the first geometric feature; and
   operating a processor to reduce the coordinate measurement data in the second data set of the two or more data sets to a second reduced data set in a second data reduction manner associated with the second geometric feature, the second data reduction manner being different from the first data reduction manner.

2. The method of claim 1, wherein operating a coordinate measuring machine to generate the coordinate measurement data comprises operating a scanning coordinate measuring machine to generate point cloud data.

3. The method of claim 1, wherein the coordinate measurement data comprises data generated by a 3D scanner.

4. The method of claim 1, further comprising:
   determining a characteristic of a first geometric feature using the first reduced data set; and
   determining a characteristic of a second geometric feature using the second reduced data set.

5. The method of claim 1, wherein the first data set and the second data set include data points which are included in both the first data set and the second data set.

6. The method of claim 1, wherein the electronic file comprises an inspection plan for a coordinate measuring machine.

7. The method of claim 1, wherein operating a computer-implemented system to segment the coordinate measurement data comprises segmenting the coordinate measurement data in a manner which is defined prior to receiving the coordinate measurement data.

8. The method of claim 1, further comprising operating a computer-implemented system to identify the distinct geometric features of the object using the electronic file by using a pre-defined set of computer-readable instructions stored on a non-transitory computer storage device to perform steps which identify the distinct geometric features of the object using data from the electronic file.

9. A method comprising:
   operating a coordinate measuring machine to measure a physical object to generate coordinate measurement data;
   using a computer-implemented system to identify geometric feature information using a CAD model containing nominal geometric information for an object, including identifying nominal geometric information for a first geometric feature of the object and for a second geometric feature of the object; and
   using a computer-implemented system to define a first data segmentation volume associated with the first geometric feature of the object and a second data segmentation volume associated with the second geometric feature of the object;
   transforming the coordinate measurement data of the physical object to a coordinate system of the CAD model, the coordinate measurement data comprising a plurality of data points;
   designating data points which are located within the defined first data segmentation volume as being associated with the first geometric feature; and
   designating data points which are located within the defined second data segmentation volume as being associated with the second geometric feature.

10. The method of claim 9, wherein the coordinate measurement data comprises a point cloud.

11. The method of claim 9, further comprising:
   reducing the data points associated with the first geometric feature in a first manner; and
   reducing the data points associated with the second geometric feature using a second manner, different from the first manner.

12. The method of claim 9, wherein the geometric feature information originating from a CAD model of an object comprises tolerance information associated with the first geometric feature.

13. The method of claim 9, wherein the geometric feature information comprises information regarding a type of the first geometric feature.

14. A method comprising:
   receiving an identification of a type of geometric characteristic to be inspected on a geometric feature, the identification of the type of geometric characteristic having originated from a CAD model of a nominal object which includes the geometric feature;
   operating a coordinate measuring machine to generate coordinate measurement data of a physical geometric feature that corresponds to the geometric feature of the CAD model;
   using a computer-implemented system to determine a manner of reducing the coordinate measurement data, wherein the determination of the manner is based at least in part on the identified type of the geometric characteristic to be inspected.

15. At least one computer-readable non-transitory storage medium device having computer-readable instructions for performing steps of a method of segmenting and reducing coordinate measurement data, the method comprising:
   receiving coordinate measurement data associated with a measurement of a physical object;
   identifying first and second distinct geometric features of the object using a CAD model containing nominal geometric information for an object that corresponds to the physical object;
   operating a computer-implemented system to segment the coordinate measurement data into two or more data sets, a first data set of the two or more data sets being associated with the first distinct geometric feature of the object, a second data set of the two or more data sets being associated with the second distinct geometric feature of the object;
   operating a computer-implemented system to reduce the coordinate measurement data in the first data set of the two or more data sets to a first reduced data set using a first manner associated with the first geometric feature; and
   operating a computer-implemented system to reduce the coordinate measurement data in the second data set of the two or more data sets to a second reduced data set using a second manner associated with the second geometric feature, the second manner being different from the first manner.

16. The method of claim 1, wherein the first data reduction manner is selected based at least in part on a user input.

17. The method of claim 1, wherein the first data reduction manner is selected based at least in part on a user input regarding a point sampling strategy.

18. The method of claim 14, wherein the determination of the manner is based at least in part on a user input regarding a point sampling strategy.

* * * * *